United States Patent
Chang et al.

(10) Patent No.: US 10,165,672 B2
(45) Date of Patent: Dec. 25, 2018

(54) SHIELDING CLIP AND ELECTRONIC DEVICE

(71) Applicant: Sercomm Corporation, Taipei (TW)

(72) Inventors: Cheng-Chung Chang, Taipei (TW); Yuan-Long Li, Taipei (TW)

(73) Assignee: Sercomm Corporation, Taipei (TW)

( * ) Notice: Subject to any disclaimer, the term of this patent is extended or adjusted under 35 U.S.C. 154(b) by 119 days.

(21) Appl. No.: 15/296,051

(22) Filed: Oct. 18, 2016

(65) Prior Publication Data

US 2017/0135200 A1     May 11, 2017

(30) Foreign Application Priority Data

Nov. 11, 2015    (CN) .......................... 2015 1 0766134

(51) Int. Cl.
| | | |
|---|---|---|
| H05K 1/02 | (2006.01) | |
| F16B 2/22 | (2006.01) | |
| H05K 3/30 | (2006.01) | |
| H05K 9/00 | (2006.01) | |
| H05K 3/34 | (2006.01) | |

(52) U.S. Cl.
CPC ............. *H05K 1/0216* (2013.01); *F16B 2/22* (2013.01); *H05K 3/301* (2013.01); *H05K 9/0035* (2013.01); *H05K 3/3447* (2013.01); *H05K 2201/10371* (2013.01); *H05K 2201/2018* (2013.01)

(58) Field of Classification Search
CPC ........................... H05K 9/0032–9/0035; H05K 9/0015–9/0016; H05K 1/02; H05K 1/0216; G06H 1/184

USPC .......... 361/752–759, 816, 818; 174/350, 354
See application file for complete search history.

(56) References Cited

U.S. PATENT DOCUMENTS

| | | | | |
|---|---|---|---|---|
| 5,354,951 A | * | 10/1994 | Lange, Sr. ........... | H05K 9/0032 174/372 |
| 6,122,167 A | * | 9/2000 | Smith ..................... | G06F 1/182 257/E23.088 |
| 2013/0089992 A1 | | 4/2013 | Yang | |
| 2013/0148318 A1 | * | 6/2013 | Kim ..................... | H05K 9/0035 361/759 |

FOREIGN PATENT DOCUMENTS

| | | |
|---|---|---|
| CN | 201577264 | 9/2010 |
| CN | 102149268 | 8/2011 |
| CN | 202111986 | 1/2012 |

(Continued)

OTHER PUBLICATIONS

"Office Action of China Counterpart Application," dated Dec. 5, 2017, p. 1-p. 7.

*Primary Examiner* — Tuan T Dinh
(74) *Attorney, Agent, or Firm* — JCIPRNET (57) ABSTRACT

A shielding clip and an electronic device are provided. The electronic device includes a circuit board, an electronic element, a shielding cover and the shielding clip. The shielding clip comprises a bottom plate parallel to the circuit board. The bottom plate has a first side region and a second side region. The first side region has a first pin extending into the circuit board and a first buckle plate extending away from the circuit board to buckle the shielding cover. The second side region has a second pin extending into the circuit board and a second buckle plate extending away from the circuit board to buckle the shielding cover.

17 Claims, 5 Drawing Sheets

(56) References Cited

FOREIGN PATENT DOCUMENTS

| | | |
|---|---|---|
| CN | 102595863 | 7/2012 |
| CN | 103167789 | 6/2013 |
| CN | 103168510 | 6/2013 |
| CN | 205082130 | 3/2016 |
| CN | 205105523 | 3/2016 |
| CN | 205105524 | 3/2016 |
| CN | 205105525 | 3/2016 |

* cited by examiner

SHIELDING CLIP AND ELECTRONIC DEVICE

CROSS-REFERENCE TO RELATED APPLICATION

This application claims the priority benefit of China application serial no. 201510766134.9, filed on Nov. 11, 2015. The entirety of the above-mentioned patent application is hereby incorporated by reference herein and made a part of this specification.

BACKGROUND OF THE INVENTION

Field of the Invention

The invention relates to a clamp and an electronic device, and particularly relates to a shielding clip and an electronic device.

Description of Related Art

Along with development of technology, an information load processed by a communication product is getting larger and larger, and a signal transmission speed also becomes faster and faster. However, electromagnetic interference is likely to be produced between an antenna, an electronic element and a circuit of a circuit board of the communication product. Generally, a metal shielding is adopted to cover the electronic element to shield an electromagnetic wave produced by the electronic element and prevent an external electromagnetic wave from interfering the electronic element, such that the communication product is complied with related specifications of electromagnetic interference testing, and operation stability thereof is improved. The commonly used metal shielding includes a frame fixed on the circuit board and a shielding cover assembled to the frame. However, since shapes of the metal shieldings required by different communication products are different, different frames and molds have to be prepared for different communication products, which results in more the cost of the communication products.

SUMMARY OF THE INVENTION

The invention is directed to a shielding clip and an electronic device, which is adapted to be applied to shielding covers of different shapes, so as to reduce cost of the communication products.

The invention provides a shielding clip, adapted for fixing a shielding cover on a circuit board. The shielding clip comprises a bottom plate parallel to an XY plane and having a first side region and a second side region. The first side region has a first pin extending toward a −Z direction and a first buckle plate extending toward a +Z direction. The second side region has a second pin extending toward the −Z direction and a second buckle plate extending toward the +Z direction.

The invention provides an electronic device comprising a circuit board; an electronic element, a shielding cover and a first shielding clip. The electronic element is disposed on the circuit board. The shielding cover is disposed on the circuit board and covers the electronic element. The first shielding clip is fixed on the circuit board and secures a corner of the shielding cover on the circuit board. The first shielding clip comprises a first bottom plate parallel to the circuit board. The first bottom plate has a first side region and a second side region. The first side region has a first pin extending into the circuit board and a first buckle plate extending away from the circuit board to buckle the shielding cover. The second side region has a second pin extending into the circuit board and a second buckle plate extending away from the circuit board to buckle the shielding cover.

One of the advantages of the shielding clip is that the cost required for reproducing the matched frame in response to the shape of the shielding cover is reduced, and the overall cost of the electronic device is reduced.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
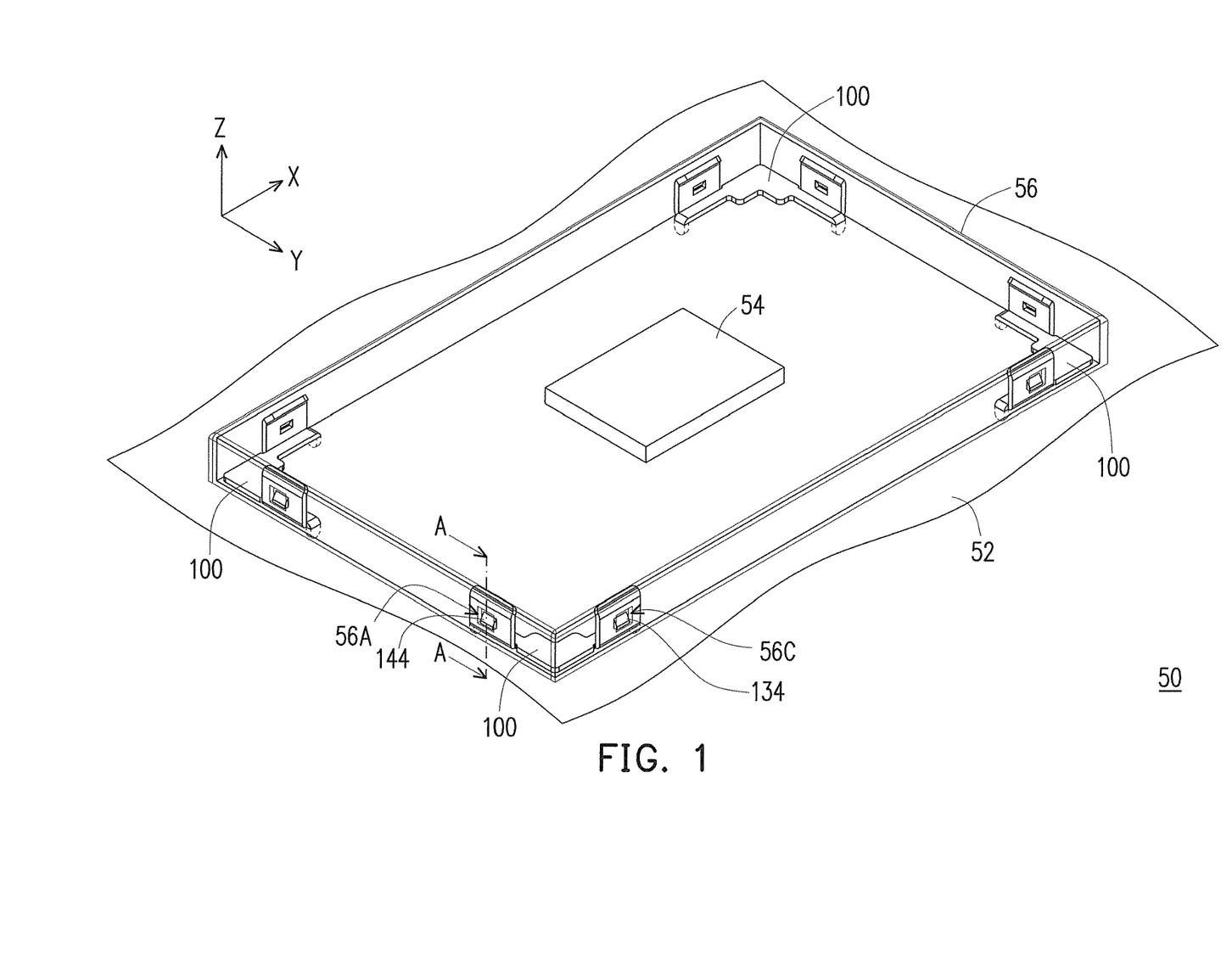
FIG. 1 is a three-dimensional view of shielding clips applied to an electronic device according to an embodiment of the invention.
Figure 2A:
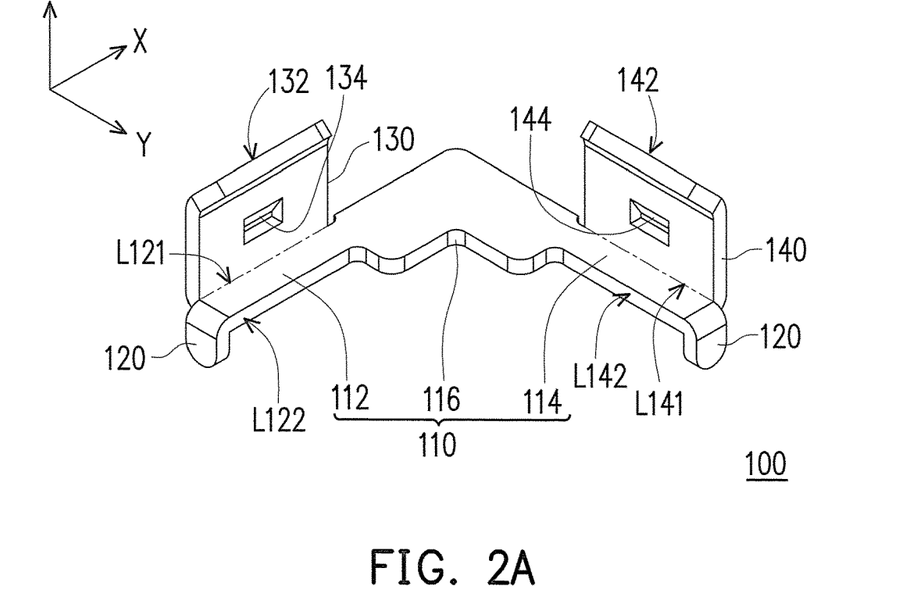
FIG. 2A is a three-dimensional view of the shielding clip of FIG. 1.

FIG. 1 is a three-dimensional view of shielding clips applied to an electronic device according to an embodiment of the invention. FIG. 2A is a three-dimensional view of the shielding clip of FIG. 1. Referring to FIG. 1 and FIG. 2A, besides the other components that are not shown, the electronic device 50 of the present embodiment includes a circuit board 52, an electronic element 54, a shielding cover 56 and a plurality of first shielding clips 100. To facilitate observing relative positions of various components, the shielding cover 56 in FIG. 1 is presented in a transparent manner, though the shielding cover 56 is frequently not transparent. The electronic element 54 is disposed on the circuit board 52 and is electrically connected to the circuit board 52. The shielding cover 56 is disposed on the circuit board 52 and covers the electronic element 54. Each of the first shielding clips 100 has a first bottom plate 110. The first bottom plate 110 and the circuit board 52 are parallel to an XY plane, and the first bottom plate 110 has a first side region 112 and a second side region 114.

Referring to FIG. 2A, the first side region 112 has a first pin 120 extending toward −Z direction along a plane parallel to the YZ plane, and a first buckle plate 130 extending from a lateral side L121 toward +Z direction along a plane parallel to the XZ plane. A lateral side L122 and the lateral side L121 are on two opposite sides of the first side region 112, and the lateral side L122 is a free side, meaning there is no other component extending therefrom. The second side region 114 has a second pin 120 extending toward −Z direction along a plane parallel to the XZ plane, and a second buckle plate 140 extending from a lateral side L141 toward +Z direction along a plane parallel to the YZ plane. A lateral side L142 and the lateral side L141 are on two opposite sides of the second side region 114, and the lateral side L142 is a free side, meaning there is no other component extending therefrom. The first bottom plate 110 is attached on a surface of the circuit board 52. The first and second pins 120 are inserted into the circuit board 52. The first buckle plate 130 and the second buckle plate 140 are erected on the surface of the circuit board 52 to buckle the shielding cover 56. The structure mentioned in this paragraph ensures that the first shielding clips 100 can be fixed on the circuit board 52 firmly and secure a corner of the shielding cover 56 stably.

In the electronic device 50 of the present embodiment, each of the first shielding clips 100 may provide the first buckle plate 130 and the second buckle plate for buckling the shielding cover 56. As long as a plurality of the first shielding clips 100 is applied, the shielding cover 56 can be fixed on the circuit board 52 firmly. Moreover, since the shielding cover 56 is fixed through a buckling mariner, in case of maintenance, it is unnecessary to perform a desoldering step as that does of the conventional technique. Moreover, each of the first shielding clips 100 includes two buckle plates (the first buckle plate 130 and the second buckle plate 140), which reduces a dimension error probably accumulated when each buckle plate is independently positioned on the circuit board 52. Moreover, configuration of the first and second pins 120 also improves positioning accuracy and stability of the first shielding clips 100 on the circuit board 52.

The first buckle plate 130 of the embodiment of FIG. 2A is substantially parallel to an XZ plane, and the second buckle plate 140 is substantially parallel to a YZ plane, so as to match sidewalls of the shielding cover 56 generally perpendicular to the XY plane. The lateral side L121 between the first buckle plate 130 and the first side region 112 is substantially parallel to an X-axis, and the lateral side L141 between the second buckle plate 140 and the second side region 114 is substantially parallel to a Y-axis. Most of the shielding covers 56 have shapes including a plurality of right-angle corners. The first shielding clips 100 are adopted to secure the right-angle corners of the shielding cover 56 on the circuit board 52. Therefore, the shielding covers 56 can be firmly fixed on the circuit board 52 by using a proper number of the first shielding clips 100. It is unnecessary to adopt the first shielding clips 100 in different shapes while the shielding covers 56 in different shapes are required by different products, and the cost required for designing and producing different molds for the first shielding clips 100 in different shapes is saved. A side of the first buckle plate 130 away from the first bottom plate 110 has an oblique guide surface 132, and a side of the second buckle plate 140 away from the first bottom plate 110 has an oblique guide surface 142. When the shielding cover 56 is combined with the first shielding clips 100, if the shielding cover 56 is not completely aligned to the first shielding clips 100, the oblique guide surfaces 132 and 142 may guide the shielding cover 56 to successfully combine with the first shielding clips 100. The first bottom plate 110 further has a vacuum pickup region 116 between the first side region 112 and the second side region 114. An area of the vacuum pickup region 116 is between 4.4 $mm^2$ and 8 $mm^2$. In order to automate an assembly process, a mechanical arm is generally used to automatically pick up the first shielding clip 100 and fix the same on the circuit board 52. When the mechanical arm uses a vacuum pickup head to pick up the first shielding clip 100, the vacuum pickup region 116 may provide a plane required by the vacuum pickup head for picking up. Moreover, the vacuum pickup region 116 is disposed between the first side region 112 and the second side region 114, so that it is easy to achieve gravity balance when the first shielding clip 100 is picked up, so as to improve a pickup success rate. The electronic element 54 can be a communication chip or other electronic element that might have issue about electromagnetic interference.

Figure 2B:
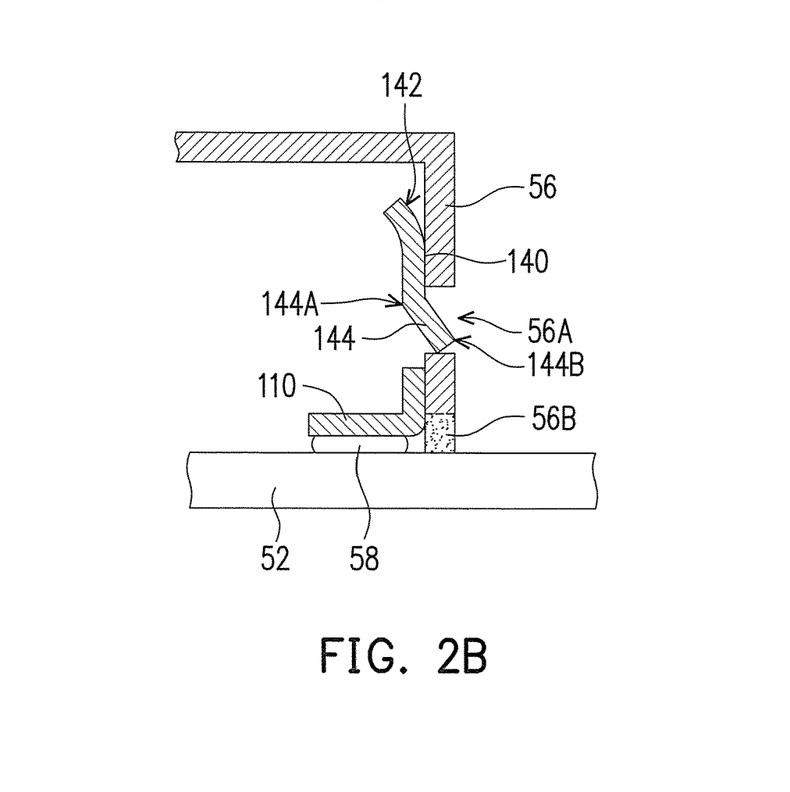
FIG. 2B is a cross-sectional view of the shielding clip of the electronic device of FIG. 1 along a section line A-A.

FIG. 2B is a cross-sectional view of the shielding clip of the electronic device of FIG. 1 along a section line A-A in XZ plane. Referring to FIG. 1 and FIG. 2B, a material of a portion 56B of the shielding cover 56 contacting the circuit board 52 is conductive flexible material, for example, conductive silicon. The first bottom plate 110 is, for example, electrically connected to the circuit board 52 through tin solder. However, regarding the portion without the first shielding clip 100, if the shielding cover 56 does not contact the circuit 52, a gap is remained. Therefore, the shielding cover 56 preferably contacts the circuit board 52 completely without leaving the gap. In order to prevent the circuit board 52 from scratched by the shielding cover 56, material of the portion 56B of the shielding cover 56 contacting the circuit board 52 adopts the conductive flexible material, such as conductive silicon. The portion 56B made of the conductive flexible material is elastic, so that whatever the edge of the shielding cover 56 and the surface of the circuit board 52 are smooth or not, the gap between the shielding cover 56 and the circuit board 52 can be properly filled by the portion 56B, and the leakage of electromagnetic wave can be reduced. A height of the portion 56B of the conductive flexible material is, for example, 0.1 mm. Regardless of the shape of the shielding cover 56, the whole round of bottom rim of the shielding cover 56 facing the circuit board 52 may include the portion 56B of the conductive flexible material. Moreover, in order to strengthen grounding of the shielding cover 56, the portion 56B of the conductive flexible material can be leaned against the circuit board 52 through other conductive material (for example, tin solder/solder paste) on the surface of the circuit board 52. The first shielding clip 100 is, for example, installed on the circuit board 52 through a surface mounting technology (SMT), and the first bottom plate 110 of the first shielding clip 100 is connected to the circuit board 52 through a tin solder 58. The shielding cover 56 of the present embodiment and the first shielding clips 100 are, for example, combined to each other through a buckling manner, which has a better fixing effect compared to a clipping manner, and is not easy to be loosed during a transportation process due to vibration.

The shielding cover 56 has a first opening 56C and a second opening 56A as shown in FIG. 1. The first buckle plate 130 has a first resilient piece 134 for protruding into the first opening 56C and buckling the shielding cover 56. The first resilient piece 134 is a part of the first buckle plate 130 and fabricated by punching process and bending process. The second buckle plate 140 has a second resilient piece 144 for protruding into the second opening 56A and buckling the shielding cover 56. The second resilient piece 144 is a part of the second buckle plate 140 and fabricated by punching process and bending process. The first resilient piece 134 and the second resilient piece 144 have similar configuration, and the detail description of the first resilient piece 134 is omitted here. The second resilient piece 144 has a second connection lateral side 144A and a second free lateral side 144B as shown in FIG. 2B. The second connection lateral side 144A and the second free lateral side 144B are two opposite sides of the second resilient piece 144. The second connection lateral side 144A is connected to the other portion of the second buckle plate 140, and the second free lateral side 144B means that there is no other component extending therefrom. The second free lateral side 144B is closer to the second pin 120 than the second connection lateral side 144A is. That is, the second free lateral side 144B is closer to the circuit board 52 than the second connection lateral side 144A is. The second free lateral side 144B leans against an edge of the second opening 56A. The opening 56A is corresponding to the first resilient piece 144 for accommodating the first resilient piece 144. Through the design of the first resilient piece 144, when the shielding cover 56 is pressed down, the first resilient piece 144 will be pressed by the shielding cover 56 and recover until the second free lateral side 144B leans against an edge of the second opening 56A. Once the second free lateral side 144B leans against an edge of the second opening 56A, the shielding cover 56 is buckled to the first shielding clip 100. Otherwise, it is relatively difficult to disassemble the shielding cover 56 since the second free lateral side 144B leans against an edge of the second opening 56A, so that the shielding cover 56 is not easy to be loosened. Moreover, the first shielding clips 100 of the present embodiment are, for example, located within a region covered by the shielding cover 56, so as to avoid influencing a circuit design outside the region covered by the shielding cover 56. In other words, the shielding clip 100 is completely covered (or overlapped) by the shielding cover 56 on the circuit board.

Figure 3:
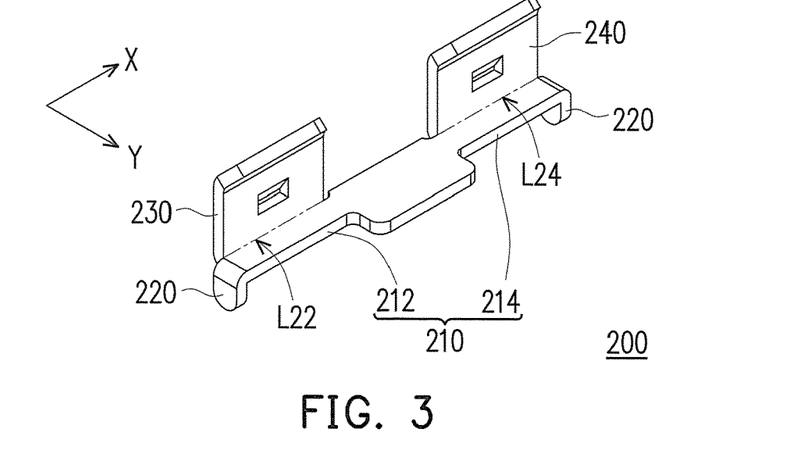
FIG. 3 is a three-dimensional view of shielding clip according to another embodiment of the invention.

FIG. 3 is a three-dimensional view of shielding clip according to another embodiment of the invention. Referring to FIG. 3, the second shielding clip 200 of the present embodiment is similar to the first shielding clip 100 of FIG. 1. The second shielding clip 200 has a second bottom plate 210. The second bottom plate 210 has a third side region 212 and a fourth side region 214. The third side region 212 has a second pin 220 extending into the circuit board 56 (shown in FIG. 1) and a third buckle plate 230 extending away from the circuit board 56. The fourth side region 214 has a second pin 220 extending into the circuit board 56 and a fourth buckle plate 240 extending away from the circuit board 56. A difference between the second shielding clip 200 of the present embodiment and the first shielding clip 100 of FIG. 1 is that a connection line L22 between the third buckle plate 230 and the third side region 212 is substantially parallel to a connection line L24 between the fourth buckle plate 240 and the fourth side region 214. In other words, the third buckle plate 230 and the fourth buckle plate 240 extends along a same plane. Therefore, the second shielding clip 200 is adapted to be applied to a long side of the shielding cover.

Figure 4:
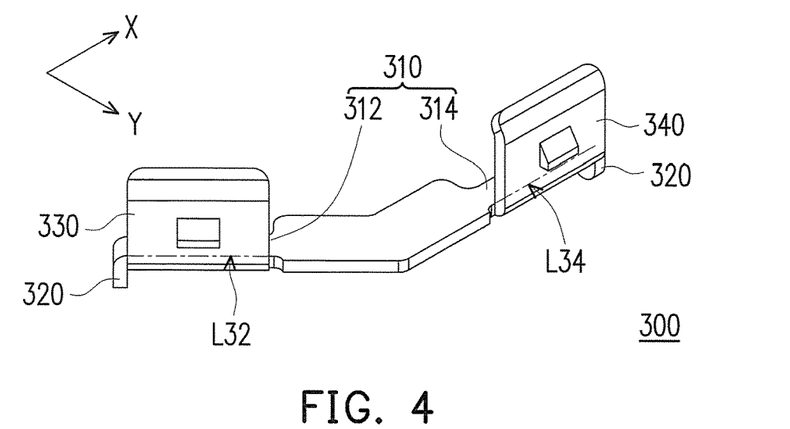
FIG. 4 is a three-dimensional view of a shielding clip according to another embodiment of the invention.

FIG. 4 is a three-dimensional view of a shielding clip according to another embodiment of the invention. Referring to FIG. 4, the third shielding clip 300 of the present embodiment is similar to the first shielding clip 100 of FIG. 1. The third shielding clip 300 has a third bottom plate 310. The third bottom plate 310 has a fifth side region 312 and a sixth side region 314. The fifth side region 312 has a third pin 320 extending into the circuit board 56 (shown in FIG. 1) and a fifth buckle plate 330 extending away from the circuit board 56. The sixth side region 314 has a third pin 320 extending into the circuit board 56 and a sixth buckle plate 340 extending away from the circuit board 56. A difference between the third shielding clip 300 of the present embodiment and the first shielding clip 100 of FIG. 1 is that an included angle between a connection line L32 between the fifth buckle plate 330 and the fifth side region 312 and a connection line L34 between the sixth buckle plate 340 and the sixth side region 314 is substantially 135 degrees. In other words, the fifth buckle plate 330 and the sixth buckle plate 340 extends along two planes that have a 135 degrees included angle therebetween. Therefore, the third shielding clip 300 is adapted to be applied to a corner of the shielding cover with an angle of 135 degrees. Certainly, the shielding clips with different included angles can also be designed for applying to the corners of the shielding cover with other angles.

Figure 5:
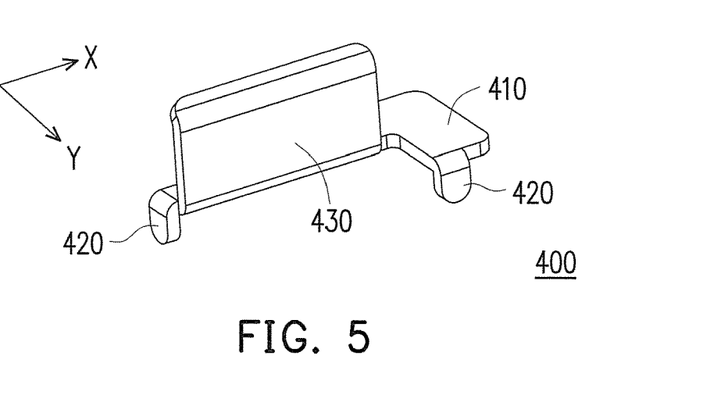
FIG. 5 is a three-dimensional view of a shielding member used in an electronic device according to an embodiment of the invention.
Figure 6:
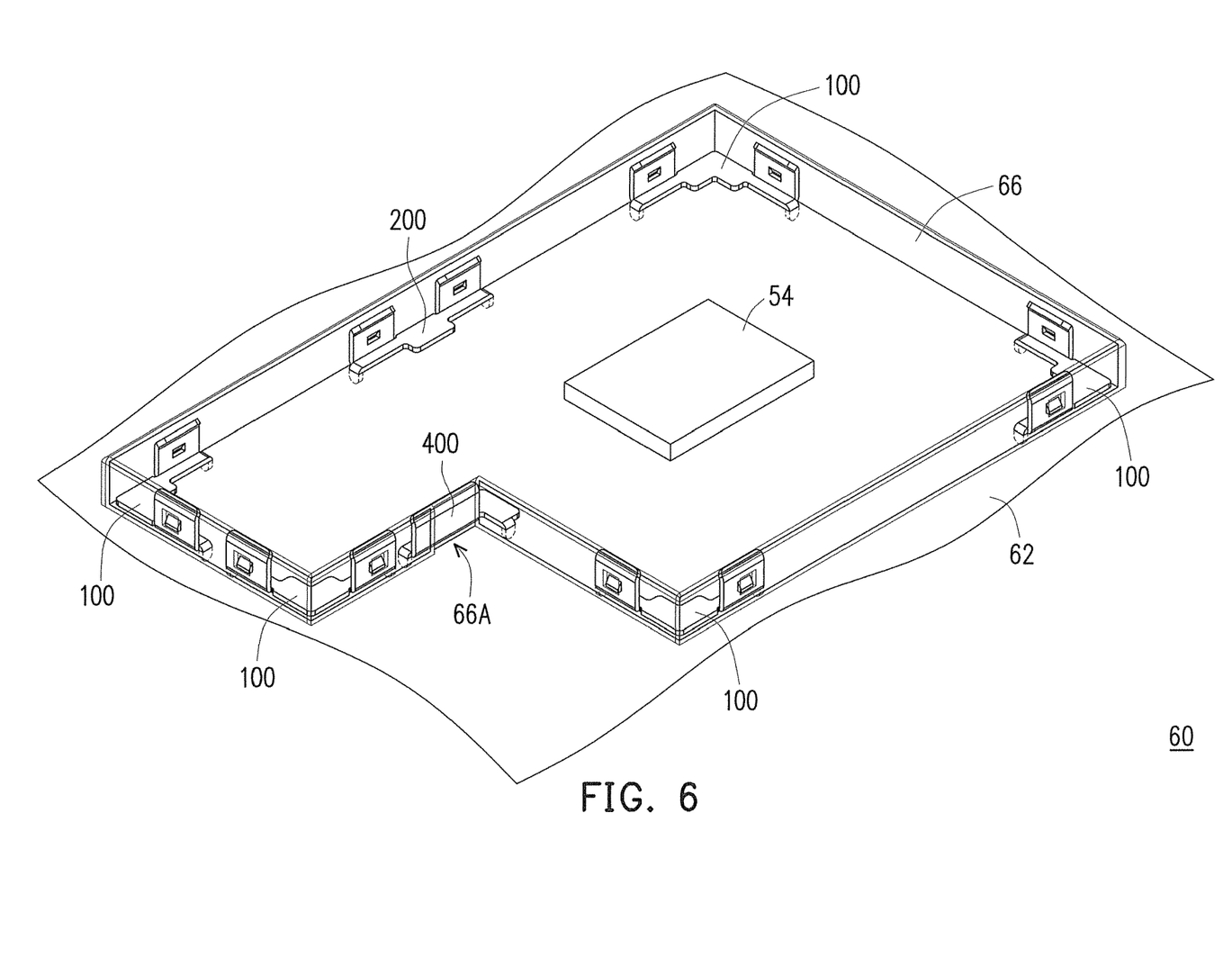
FIG. 6 is a three-dimensional view of an electronic device according to another embodiment of the invention.

FIG. 5 is a three-dimensional view of a shielding member used in an electronic device according to an embodiment of the invention. FIG. 6 is a three-dimensional view of an electronic device according to another embodiment of the invention. Referring to FIG. 5 and FIG. 6, the electronic device 60 of the present embodiment is similar to the electronic device 50 of FIG. 1, and a difference there between is that the electronic device 60 further includes a shielding member 400 having a fourth bottom plate 410. The fourth bottom plate 410 has a plurality of fourth pins 420 extending into the circuit board 56 (shown in FIG. 1) and a baffle plate 430 extending away from the circuit board 56. The fourth bottom plate 410 is parallel to the XY plane. The fourth bottom plate 410 is attached on the surface of the circuit board 62. The baffle plate 430 is erected on the surface of the circuit board 62 to shield an opening 66A of the shielding cover 66. By using the first shielding clips 100, the second shielding clip 200 and the shielding member 400, the shielding cover 66 can be fixed on the circuit board 62 to avoid electromagnetic wave leakage.

Figure 7:
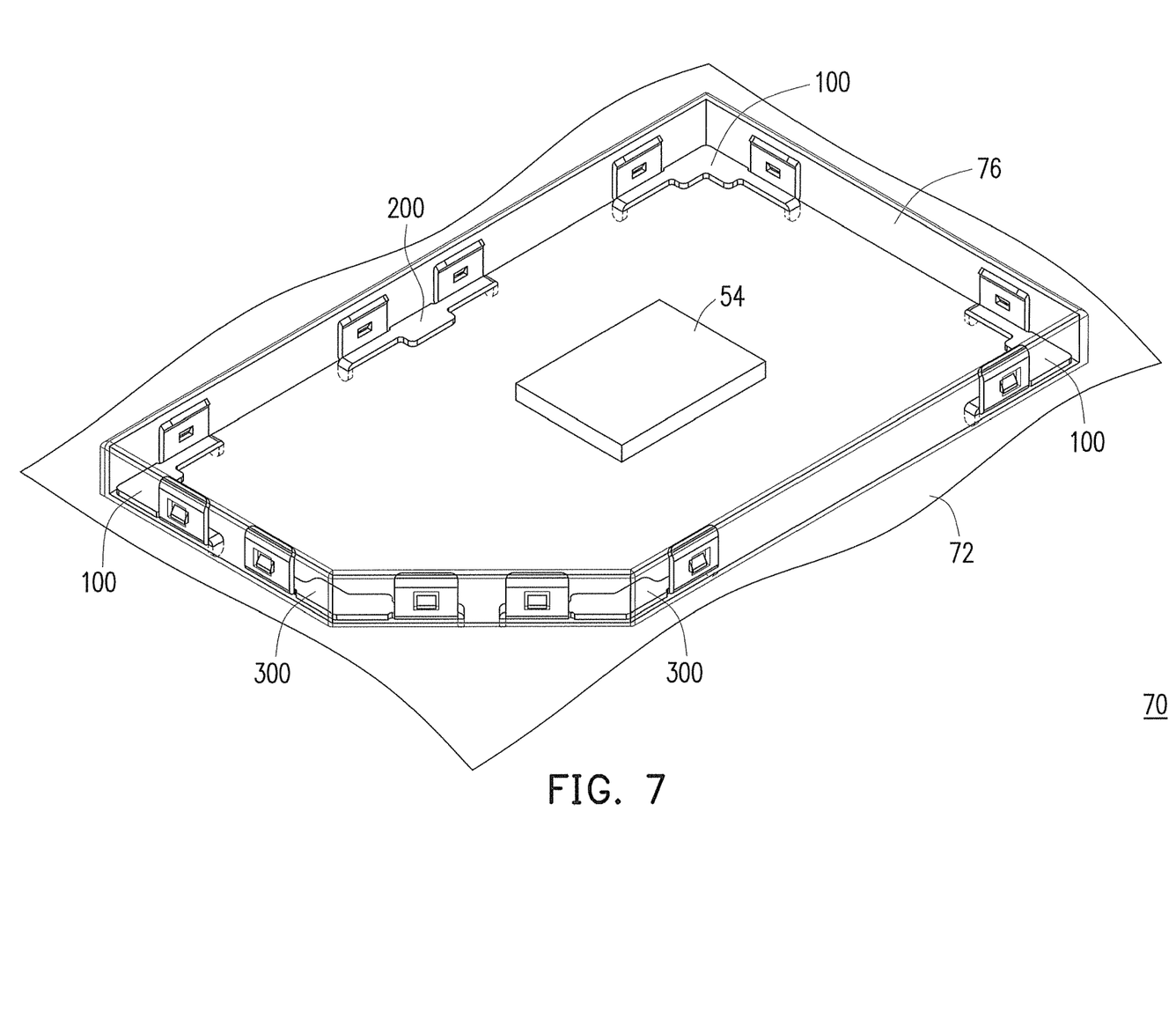
FIG. 7 is a three-dimensional view of an electronic device according to another embodiment of the invention.

FIG. 7 is a three-dimensional view of an electronic device according to another embodiment of the invention. Referring to FIG. 7, the electronic device 70 of the present embodiment is similar to the electronic device 50 of FIG. 1, and a difference there between is that in the electronic device 70, by using the first shielding clips 100, the second shielding clip 200 and the third shielding clips 300, the shielding cover 76 can be fixed on the circuit board 72 to avoid electromagnetic wave leakage.

In summary, in the shielding clip and the electronic device provided by the invention, the conventional frame is divided into a plurality of shielding clips. When a shape of the shielding cover is changed, as long as the amount of the shielding clips and the configuration positions thereof are changed, the shielding cover can be properly fixed on the circuit board, such that it is unnecessary to fabricate a new frame with the corresponding shape, by which the overall cost of the electronic device is reduced.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A shielding clip, adapted for fixing a shielding cover on a circuit board, the shielding clip comprising:
   a bottom plate, parallel to an XY plane and having a first side region and a second side region;
   wherein:
   the first side region has a first pin extending toward a −Z direction and a first buckle plate extending toward a +Z direction; and
   the second side region has a second pin extending toward the −Z direction and a second buckle plate extending toward the +Z direction, wherein:
the first side region has a first lateral side from which the first buckle plate extends toward the +Z direction and a second lateral side that is a free side, and the first and second lateral side are two opposite side of the first side region; and the second side region has a third lateral side from which the second buckle plate extends toward the +Z direction and the fourth lateral side that is a free side, and the third and fourth lateral side are two opposite side of the second side region.

2. The shielding clip of claim 1, wherein the first pin and the second pin extends along two different planes.

3. The shielding clip of claim 1, wherein the first pin and the first buckle plate extend along two planes that are perpendicular to each other, and the second pin and the second buckle plate extend along two planes that are perpendicular to each other.

4. The shielding clip as claimed in claim 1, wherein the first buckle plate and the second buckle plate respectively have an oblique guide surface at a side away from the bottom plate, the bottom plate further has a vacuum pickup region between the first side region and the second side region for being picked up by a vacuum pickup head, and an area of the vacuum pickup region is between 4.4 mm$^2$ and 8 mm$^2$.

5. The shielding clip as claimed in claim 1, wherein the shielding cover has a first opening and a second opening, the first buckle plate has a first resilient piece for protruding into the first opening and buckling the shielding cover, the second buckle plate has a second resilient piece for protruding into the second opening and buckling the shielding cover, the first resilient piece has a first connection lateral side and a first free lateral side, the first connection lateral side and the first free lateral side are two opposite sides of the first resilient piece, the first free lateral side is closer to the first pin than the first connection lateral side, the first free lateral side leans against an edge of the first opening, the second resilient piece has a second connection lateral side and a second free lateral side, the second connection lateral side and the second free lateral side are two opposite sides of the second resilient piece, the second free lateral side is closer to the second pin than the second connection lateral side, and the second free lateral side leans against an edge of the second opening.

6. The shielding clip of claim 2, wherein the two different planes along which the first pin and the second pin extend are perpendicular to each other.

7. An electronic device, comprising:
a circuit board;
an electronic element, disposed on the circuit board;
a shielding cover, disposed on the circuit board and covering the electronic element; and
a first shielding clip fixed on the circuit board and securing a corner of the shielding cover on the circuit board, wherein:
the first shielding clip comprises a first bottom plate parallel to the circuit board, the first bottom plate has a first side region and a second side region;
the first side region has a first pin extending into the circuit board and a first buckle plate extending away from the circuit board to buckle the shielding cover; and
the second side region has a second pin extending into the circuit board and a second buckle plate extending away from the circuit board to buckle the shielding cover, wherein:
the first side region has a first lateral side from which the first buckle plate extends away from the circuit board and a second lateral side that is a free side, and the first and second lateral side are two opposite side of the first side region; and the second side region has a third lateral side from which the second buckle plate extends away from the circuit board and a fourth lateral side that is a free side, and the third and fourth lateral side are two opposite side of the second side region.

8. The electronic device of claim 7, wherein the first pin and the second pin extends along two different planes.

9. The electronic device of claim 7, wherein the first pin and the first buckle plate extend along two planes that are perpendicular to each other, and the second pin and the second buckle plate extend along two planes that are perpendicular to each other.

10. The electronic device of claim 7, wherein the first shielding clip is completely covered by the shielding cover on the circuit board.

11. The electronic device of claim 7, wherein a material of a portion of a portion of the shielding cover contacting the circuit board is a conductive flexible material.

12. The electronic device as claimed in claim 7, wherein the first buckle plate and the second buckle plate respectively have an oblique guide surface at a side away from the circuit board, the first bottom plate further has a vacuum pickup region between the first side region and the second side region for being picked up by a vacuum pickup head.

13. The electronic device as claimed in claim 7, further comprising:
a second shielding clip, comprising a second bottom plate parallel to the circuit board, wherein the second bottom plate has a third side region and a fourth side region, the third side region has a third pin extending into the circuit board and a third buckle plate extending away from the circuit board, the fourth side region has a fourth pin extending into the circuit board and a fourth buckle plate extending away from the circuit board, the third buckle plate and the fourth buckle plate extends along a same plane, and the third buckle plate and the fourth buckle plate buckle the shielding cover.

14. The electronic device as claimed in claim 7, further comprising:
a third shielding clip, comprising a third bottom plate parallel to circuit board, wherein the third bottom plate has a fifth side region and a sixth side region, the fifth side region has a fifth pin extending into the circuit board and a fifth buckle plate extending away from the circuit board, the sixth side region has a sixth pin extending into the circuit board and a sixth buckle plate extending away from the circuit board, the fifth buckle plate and the sixth buckle plate extends along two planes that have a 135 degrees included angle therebetween, and the fifth buckle plate and the sixth buckle plate buckle the shielding cover.

15. The electronic device as claimed in claim 7, further comprising:
a shielding member, comprising a fourth bottom plate parallel to circuit board, wherein the third bottom plate has a baffle plate extending away from the circuit board and a plurality of fourth pins extending into the circuit board, and the baffle plate shields an opening of the shielding cover.

16. The electronic device as claimed in claim 7, wherein the shielding cover has a first opening and a second opening, the first buckle plate has a first resilient piece for protruding into the first opening and buckling the shielding cover, the second buckle plate has a second resilient piece for protruding into the second opening and buckling the shielding cover, the first resilient piece has a first connection lateral side and a first free lateral side, the first connection lateral side and the first free lateral side are two opposite sides of the first resilient piece, the first free lateral side is closer to the first pin than the first connection lateral side, the first free lateral side leans against an edge of the first opening, the second resilient piece has a second connection lateral side and a second free lateral side, the second connection lateral side and the second free lateral side are two opposite sides of the second resilient piece, the second free lateral side is closer to the second pin than the second connection lateral side, and the second free lateral side leans against an edge of the second opening.

17. The electronic device of claim 8, wherein the two different planes along which the first pin and the second pin extend are perpendicular to each other.

* * * * *